(12) United States Patent
Short et al.

(10) Patent No.: US 7,288,981 B2
(45) Date of Patent: Oct. 30, 2007

(54) VOLTAGE TRANSLATOR CIRCUITS USING CAPACITIVE TECHNIQUES

(75) Inventors: Kenneth Dean Short, Essex Junction, VT (US); Pradeep Thiagarajan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 11/275,538

(22) Filed: Jan. 12, 2006

(65) Prior Publication Data

US 2006/0087870 A1   Apr. 27, 2006
US 2007/0159859 A1   Jul. 12, 2007

(51) Int. Cl.
*H03L 5/00*   (2006.01)
*G05F 1/10*   (2006.01)

(52) U.S. Cl. ...................................... 327/333; 327/536
(58) Field of Classification Search ................ 327/333, 327/536, 589; 326/63, 68, 80–83
See application file for complete search history.

(56) References Cited

U.S. PATENT DOCUMENTS 5,237,212 A * 8/1993 Maekawa ................... 327/333
5,751,178 A * 5/1998 Shor et al. .................. 327/333
6,255,888 B1 * 7/2001 Satomi ....................... 327/333
7,049,876 B2 * 5/2006 Heaston ...................... 327/333

* cited by examiner

*Primary Examiner*—Quan Tra
*Assistant Examiner*—Rey Aranda
(74) *Attorney, Agent, or Firm*—Schmeisen, Olsen & Watts; Michael J. LeStrange

(57) ABSTRACT

A voltage translator circuit and a method for operating the same. The voltage translator circuit includes (a) an input node, an output node, and a ground node; (b) a voltage divider circuit including a first and second resistors coupled in series between the input node and the ground node; (c) a start voltage circuit coupled to a first voltage and to the input node; (d) a transfer circuit coupled to the output node; and (e) a capacitive circuit having a first and second capacitive nodes. The first capacitive node is coupled to the voltage divider circuit. The second capacitive node is coupled (i) to the first voltage via the start voltage circuit, and (ii) to the output node via the transfer circuit. In response to the input node changing towards the first voltage, the start voltage circuit is capable of disconnecting the second capacitive node from the first voltage.

20 Claims, 2 Drawing Sheets

US 7,288,981 B2

VOLTAGE TRANSLATOR CIRCUITS USING CAPACITIVE TECHNIQUES

BACKGROUND OF THE INVENTION

1. Technical Field

The present invention relates to voltage translator circuits, and more particularly, to voltage translator circuits using capacitive techniques.

2. Related Art

In the operation of a typical voltage translator, there are a lot of current spikes. Therefore, there is a need for a voltage translator circuit (and a method for operating the same) that has less current spikes than in the prior art.

SUMMARY OF THE INVENTION

The present invention provides a voltage translator circuit, comprising (a) an input node, an output node, and a ground node, wherein the ground node is electrically coupled to ground; (b) a voltage divider circuit including a first resistor and a second resistor electrically coupled in series between the input node and the ground node; (c) a start voltage circuit electrically coupled to a first voltage and to the input node; (d) a transfer circuit electrically coupled to the output node; and (e) a capacitive circuit having a first capacitive node and a second capacitive node, wherein the first capacitive node is electrically coupled to the voltage divider circuit, wherein the second capacitive node is electrically coupled to the first voltage via the start voltage circuit, wherein the second capacitive node is electrically coupled to the output node via the transfer circuit, and wherein in response to the input node changing in voltage level towards the first voltage, the start voltage circuit is capable of electrically disconnecting the second capacitive node from the first voltage.

The present invention also provides a circuit operation method, comprising providing a voltage translator circuit which includes: (a) an input node, an output node, and a ground node, wherein the ground node is electrically coupled to ground, (b) a voltage divider circuit including a first resistor and a second resistor electrically coupled in series between the input node and the ground node, (c) a start voltage circuit electrically coupled to a first voltage and to the input node, (d) a transfer circuit electrically coupled to the output node, and (e) a capacitive circuit having a first capacitive node and a second capacitive node, wherein the first capacitive node is electrically coupled to the voltage divider circuit, wherein the second capacitive node is electrically coupled to the first voltage via the start voltage circuit, and wherein the second capacitive node is electrically coupled to the output node via the transfer circuit; and in response to the input node changing in voltage level towards the first voltage, using the start voltage circuit to electrically disconnect the second capacitive node from the first voltage.

The present invention also provides a voltage translator circuit, comprising (a) an input node, an output node, and a ground node, wherein the ground node is electrically coupled to ground; (b) a voltage divider circuit including a first resistor and a second resistor electrically coupled in series between the input node and the ground node; (c) a start voltage circuit electrically coupled to a first voltage and to the input node; (d) a transfer circuit electrically coupled to the output node; and (e) a capacitive circuit having a first capacitive node and a second capacitive node, wherein the first capacitive node is electrically coupled to the voltage divider circuit, wherein the second capacitive node is electrically coupled to the first voltage via the start voltage circuit, wherein the second capacitive node is electrically coupled to the output node via the transfer circuit, wherein in response to the input node changing in voltage level towards the first voltage, the start voltage circuit is capable of electrically disconnecting the second capacitive node from the first voltage, wherein in response to the input node changing in voltage level towards the first voltage, the voltage divider circuit and the capacitive circuit are capable of changing the second capacitive node from the first voltage to a second voltage, and wherein in response to the input node changing in voltage level towards the first voltage, the transfer circuit is capable of (i) electrically connecting the second capacitive node to the output node, and (ii) electrically disconnecting the output node from the ground node.

The present invention provides a voltage translator circuit (and a method for operating the same) using a capacitive technique that has less current spike than the prior art.

DETAILED DESCRIPTION OF THE INVENTION

Figure 1:
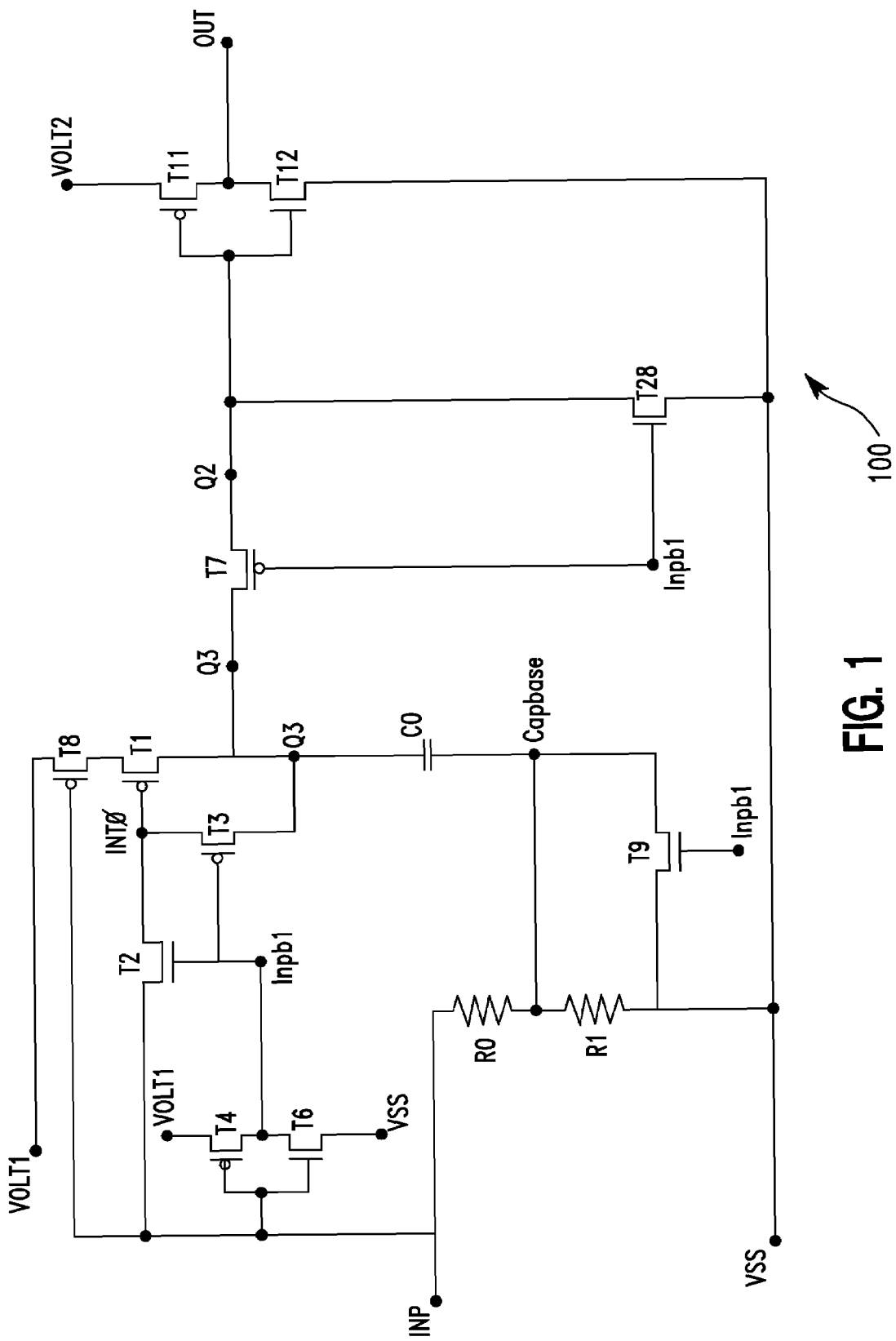
FIG. 1 shows the diagram of a voltage translator circuit, in accordance with embodiments of the present invention.

FIG. 1 shows the diagram of a voltage translator circuit 100, in accordance with embodiments of the present invention.

More specifically, with reference to FIG. 1, in one embodiment, the voltage translator circuit 100 comprises an input terminal INP, an output terminal OUT, a lower voltage supply VOLT1, a higher voltage supply VOLT2, and a ground voltage supply VSS. In one embodiment, the lower voltage VOLT1 is at 1 volt, the higher voltage VOLT2 is at 1.6 volt, and the ground voltage VSS is typically at 0 volt. In one embodiment, the circuit 100 further comprises PFETs (P-channel Field Effect Transistor) T1, T3, T4, T7, T8, and T11; NFETs (N-channel Field Effect Transistor) T2, T6, T9, T12, and T28; resistors R0 and R1; and a capacitor C0. Illustratively, T1, T2, T3, T4, T6, T7, T8, T9, T11, T12, T28, R0, R1, C0, VOLT1, VOLT2, and VSS are electrically coupled together as shown in FIG. 1. In one embodiment, the resistances of the resistors R0 and R1 are selected such that:

$$\text{VOLT2}-\text{VOLT1}=\text{VOLT1}\times R1/(R1+R0) \quad (1)$$

This equation (1) is called a design equation (1). To make description of the present invention simple, let y=VOLT2−VOLT1.

In one embodiment, the operation of the voltage translator circuit 100 is as follows. Assume that, the input terminal INP is initially at 0 volt. Therefore, T4 is on and T6 is off. As a result, a node Inpb1 is at VOLT1.

As a result of node Inpb1 being at VOLT1, T9 is on. Therefore, a node Capbase is electrically coupled to ground via T9. As a result, the voltage of the node Capbase ($V_{Capbase}$) is at 0 volt. In addition, node Inpb1 being at VOLT1 turns off T3 and turns on T2. As a result, a node INT0 is electrically coupled to the input terminal INP via T2, resulting in node INT0 being at 0 volt. Node INT0 being at 0 volt turns on T1. Besides, the input terminal INP being at 0 volt turns on T8. Because T1 and T8 are on, node Q3 is at VOLT1, resulting in the capacitor C0 being charged with a voltage of VOLT1 across the capacitor C0.

Also, because node Inpb1 is at VOLT1, T7 is off. Hence, there is no electrical connection between node Q3 and a node Q2. Besides, T28 is on due to node Inpb1 being at VOLT1. Therefore, node Q2 is linked to ground via T28, resulting in node Q2 being at 0 volt. Because node Q2 is at 0 volt, T11 is on and T12 is off. Therefore, the output terminal OUT is at VOLT2.

In short, the input terminal INP being at 0 volt causes output terminal OUT to be at VOLT2.

Next, in one embodiment, assume the input terminal INP rises from 0 volt to VOLT1. As a result, T4 is turned off and T6 is turned on. In response, node Inpb1 decreases from VOLT1 to 0 volt. As a result, T9 is turned off. Besides, R0 and R1 form a voltage divider circuit. Therefore, at node Capbase, $V_{Capbase}$ goes from 0 volt to VOLT1×R1/(R1+R0). As a result of the design equation (1), in which VOLT1× R1/(R1+R0)=(VOLT2−VOLT1), when INP goes from 0 to VOLT1, $V_{Capbase}$ goes from 0 volt to y=(VOLT2−VOLT1).

In one embodiment, the capacitance of the capacitor C0 is such that the voltage across C0 essentially does not change instantaneously when $V_{Capbase}$ changes from 0 volt to y. As a result, when $V_{Capbase}$ changes from 0 volt to y=(VOLT2− VOLT1), node Q3 jumps from the previous value of VOLT1 to (VOLT1+y)=VOLT1+(VOLT2−VOLT1)=VOLT2.

Input terminal INP increasing from 0 volt to VOLT1 turns off T8. Besides, node Inpb1 falling from VOLT1 down to 0 volt turns off T2 and turns on T3. As a result, node INT0 has the same voltage level as node Q3. Therefore, node INT0 is at VOLT2. As a result, T1 is turned off.

As a result of node Inpb1 going from VOLT1 down to 0 volt, T28 is turned off and T7 is turned on. Therefore, the voltage level of Q2 is equal to the voltage level of Q3 which is VOLT2. In response, T11 is turned off and T12 is turned on. As a result, the output terminal OUT is electrically coupled to ground via T12. Therefore, the output terminal OUT is at 0 volt.

In short, the input terminal INP rising from 0 volt to VOLT1 causes the output terminal OUT to change from VOLT2 down to 0 volt.

Next, in one embodiment, assume the input terminal INP decreases from VOLT1 to 0 volt. As a result, T4 is turned on and T6 is turned off. In response, node Inpb1 is electrically coupled to VOLT1 via T4. As a result, node Inpb1 changes from 0 volt to VOLT1. Therefore, T9 is turned on.

At node Capbase, $V_{Capbase}$ goes from y=(VOLT2− VOLT1) to 0 volt. Since the voltage across the capacitor C0 cannot change instantaneously, node Q3 drops from the previous value of VOLT2 down to VOLT2−y=VOLT2− (VOLT2−VOLT1)=VOLT1.

It should be noted that when node INP goes from 0 volt to VOLT1, T1 and T8 are turned on. This helps bring node Q3 to the voltage level VOLT1. More specifically, because T8 is electrically coupled to the input terminal INP which is at 0 volt, T8 is turned on. Node Inpb1 being at VOLT1 turns off T3 and turns on T2. Hence, node INT0 is electrically coupled to the input terminal INP. As a result, node INT0 goes to 0 volt. In response, T1 is turned on. Because both T1 and T8 are turned on, node Q3 takes the voltage level VOLT1 as described above.

On the other hand, node Inpb1 changing from 0 volt to VOLT1 turns off T7. Hence, node Q3 becomes electrically disconnected from node Q2. Also, T28 is turned on due to node Inpb1 changing from 0 volt to VOLT1. As a result, node Q2 is electrically coupled to ground via T28 and node Q2 goes to 0 volt. In response, T11 is turned on and T12 is turned off. As a result, the output terminal OUT is electrically coupled to VOLT2 via T11. Therefore, the output terminal OUT has the voltage level VOLT2.

In short, the input terminal INP decreasing from VOLT1 to 0 volt causes the output terminal OUT to rise from 0 volt to VOLT2.

As can be seen in FIG. 1, node VOLT1 is connected to ground via the capacitor C0 whereas node VOLT2 is connected to ground via the CMOS inverter T11, T12. As a result, current spikes during the operation of the voltage translator circuit 100 are minimized.

In one embodiment, the voltage translator circuit 100 is programmable for adaptability to different voltage domains by using a variable capacitor C0 and variable resistors R0 and R1. Illustratively, for given values of VOLT1 and VOLT2, the resistors R0 and R1 can be varied to satisfy the design equation (1) so that the circuit 100 can be used to translate from one voltage domain (0 volt to VOLT1) to the other voltage domain (0 volt to VOLT2).

In one embodiment, the variable resistors R0 and R1 have resistance control inputs so that the resistances of R0 and R1 can be varied by applying appropriate control signals to the resistance control inputs. In one embodiment, the variable capacitor C0 has capacitance control inputs so that the capacitance of C0 can be varied by applying appropriate control signals to the capacitance control inputs.

The capacitance of C0 determines how quickly node Q3 follows node Capbase in voltage. The higher the capacitance of C0 is, the more closely node Q3 follows node Capbase. In one embodiment, the operating frequency of the voltage translator circuit 100 can be as high as 1000 MHz.

In summary, when the input terminal INP is initially at 0 volt, a start voltage circuit (including T1, T2, T3, T4, T6, and T8) and the voltage divider circuit (including R0 and R1) ensure that node Q3 is at VOLT1. In response, the output terminal OUT is at VOLT2. When the input terminal INP rises from 0 volt to VOLT1, the start voltage circuit stops driving node Q3 such that the voltage divider circuit (including R0 and R1) and the capacitor C0 can drive Q3 from VOLT1 up to VOLT2. As a result, the output terminal OUT falls from VOLT2 down to 0 volt. Next, when the input terminal INP falls from VOLT1 down to 0 volt, the start voltage circuit and the voltage divider circuit ensure that node Q3 goes back to VOLT1 to be ready for the next cycle. As a result, the output terminal OUT rises from 0 up to VOLT2. It should be noted that node Q2 can also be considered as an output node of the voltage translator circuit 100. This is because when INP rises from 0 volt to VOLT1, node Q2 changes from 0 volt to VOLT2 and when INP falls from VOLT1 down to 0 volt, node Q2 changes from VOLT2 to 0 volt. Besides, the CMOS inverter (including T11 and T12) can be considered as a buffer circuit that couples node Q2 to the output terminal OUT.

Figure 2:
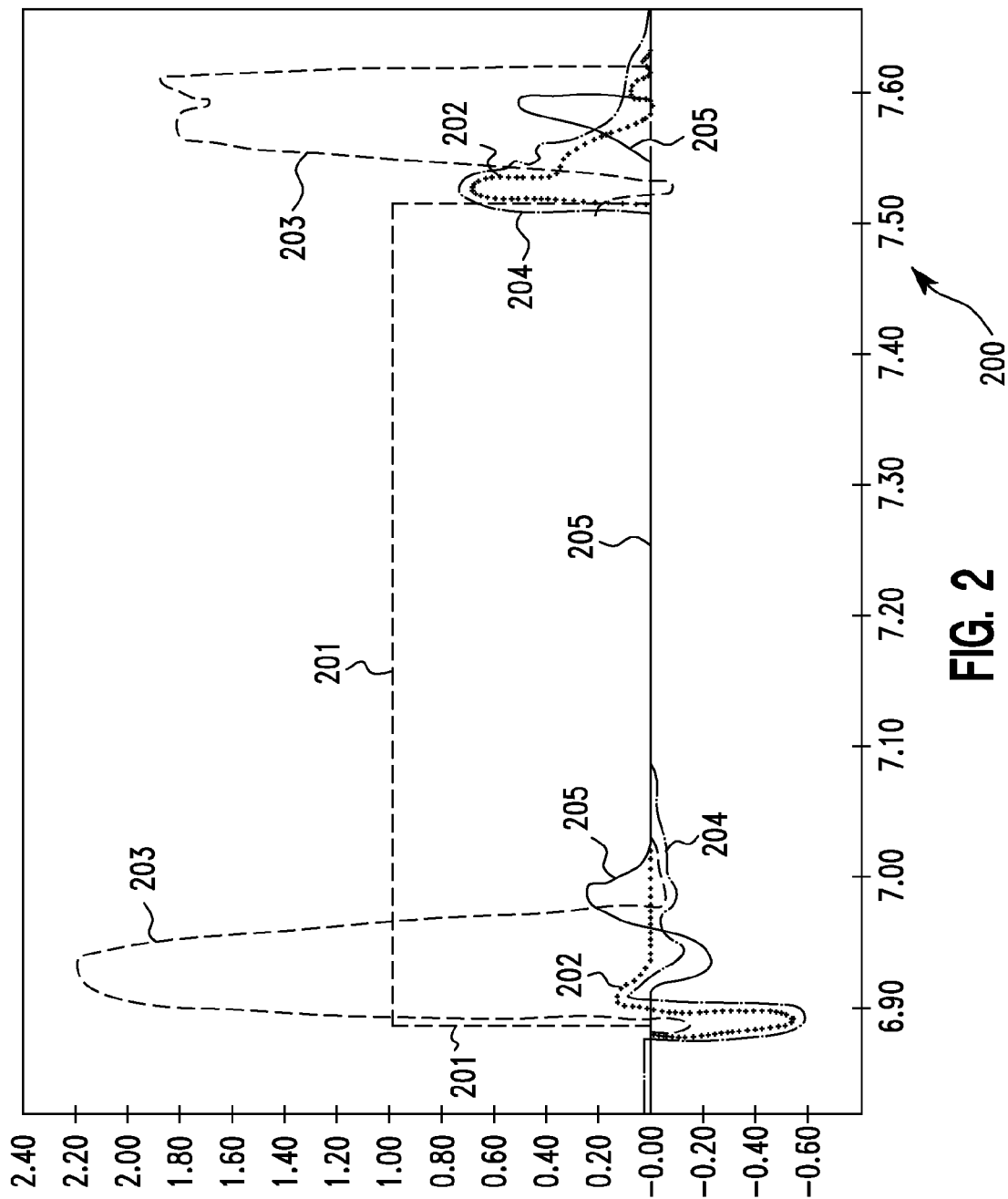
FIG. 2 shows a diagram which illustrates the waveforms of different signals at different nodes of the voltage translator circuit of FIG. 1, in accordance with embodiments of the present invention.

FIG. 2 shows a diagram 200 which illustrates the waveforms of different signals at different nodes of the voltage translator circuit 100 of FIG. 1, in accordance with embodiments of the present invention.

More specifically, in one embodiment, the diagram 200 shows reduction in current spike of the present invention in comparison with prior art. In one embodiment, line 201 illustrates the incoming signal at node INP. Line 202 illustrates the current going from the voltage supply VOLT1 to the ground voltage supply VSS in the prior art (i.e., when a conventional voltage translator is used instead of the circuit 100 of FIG. 1). Line 203 illustrates the current going from the voltage supply VOLT2 to the ground voltage supply VSS in the prior art. Line 204 illustrates the current going from the voltage supply VOLT1 to the ground voltage supply VSS in the present invention. Line 205 illustrates the current going from the voltage supply VOLT2 to the ground voltage supply VSS in the present invention.

As can be seen in FIG. 2, the lines 202 and 204 illustrate the current spikes which go from the VOLT1 to the ground in the prior art and in the present invention, respectively. Besides, the lines 203 and 205 illustrate the current spikes which go from the VOLT2 to the ground in the prior art and the present invention, respectively. It is obvious that the current spike from VOLT2 of the present invention is reduced in comparison with the prior art. The current spike from VOLT2 of the present invention has a peak of 0.2 mA at 6.95 nsec and a peak of 0.5 mA at 7.55 nsec whereas the current spike from VOLT2 of the prior art has a peak of 2.2 mA at 6.95 nsec and a peak of 1.95 mA at 7.55 nsec. So, the current spike of the present invention is one-eleventh of the prior art at 6.95 nsec, and one-fourth of the prior art at 7.55 nsec.

In one embodiment, the voltage translator circuit 100 can operate in both a step-up mode and a step-down mode. In the step-up mode, the voltage translator 100 converts the incoming signal from a lower voltage domain (VOLT1) to a higher voltage domain (VOLT2), wherein VOLT1<VOLT2. In the step-down mode, the voltage translator 100 converts the incoming signal from a higher voltage domain (0 volt to VOLT1) to a lower voltage domain (0 to VOLT2), wherein VOLT1>VOLT2.

In summary, the present invention uses a capacitive technique to eliminate fighting at nodes, hence, reducing current spikes on the voltage supplies during the incoming signal transitions.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A voltage translator circuit, comprising:
 (a) an input node, an output node, and a ground node, wherein the ground node is electrically coupled to ground;
 (b) a voltage divider circuit including a first resistor and a second resistor electrically coupled in series between the input node and the ground node;
 (c) a start voltage circuit electrically coupled to a first voltage and to the input node;
 (d) a transfer circuit electrically coupled to the output node; and
 (e) a capacitive circuit having a first capacitive node and a second capacitive node,
 wherein the first capacitive node is electrically coupled to the voltage divider circuit,
 wherein the second capacitive node is electrically coupled to the first voltage via the start voltage circuit,
 wherein the second capacitive node is electrically coupled to the output node via the transfer circuit, and
 wherein in response to the input node changing in voltage level towards the first voltage, the start voltage circuit is capable of electrically disconnecting the second capacitive node from the first voltage.

2. The voltage translator circuit of claim 1, wherein in response to the input node changing in voltage level from the first voltage to ground, the start voltage circuit is capable of electrically connecting the second capacitive node to the first voltage.

3. The voltage translator circuit of claim 1, wherein in response to the input node changing in voltage level towards the first voltage, the voltage divider circuit and the capacitive circuit are capable of changing the second capacitive node from the first voltage to a second voltage.

4. The voltage translator circuit of claim 3,
 wherein the capacitive circuit comprises a capacitor electrically coupled between the first and second capacitive nodes, wherein $V1 \times R1/(R1+R0)=V2-V1$, wherein R0 and R1 are the resistances of the first and second resistors, respectively, and
 wherein V1 and V2 are the first and second voltages, respectively.

5. The voltage translator circuit of claim 1, wherein in response to the input node changing in voltage level from the first voltage to ground, the voltage divider circuit and the capacitive circuit are capable of changing the second capacitive node from a second voltage to the first voltage.

6. The voltage translator circuit of claim 1, wherein in response to the input node changing in voltage level towards the first voltage, the transfer circuit is capable of (i) electrically connecting the second capacitive node to the output node, and (ii) electrically disconnecting the output node from the ground node.

7. The voltage translator circuit of claim 1, wherein in response to the input node changing in voltage level from the first voltage to ground node, the transfer circuit is capable of (i) electrically disconnecting the second capacitive node from the output node, and (ii) electrically connecting the output node to the ground node.

8. The voltage translator circuit of claim 1, wherein the transfer circuit comprises:
 an N-channel transistor electrically coupled between the second capacitive node and the output node; and
 a P-channel transistor electrically coupled between the output node and the ground node.

9. The voltage translator circuit of claim 1, further comprising a buffer circuit electrically coupled to a second voltage, to the output node, and to the ground node.

10. The voltage translator circuit of claim 9, wherein the buffer circuit comprises a CMOS inverter.

11. A circuit operation method, comprising:
 providing a voltage translator circuit which includes:
 (a) an input node, an output node, and a ground node, wherein the ground node is electrically coupled to ground,
 (b) a voltage divider circuit including a first resistor and a second resistor electrically coupled in series between the input node and the ground node,
 (c) a start voltage circuit electrically coupled to a first voltage and to the input node,
 (d) a transfer circuit electrically coupled to the output node, and
 (e) a capacitive circuit having a first capacitive node and a second capacitive node,
 wherein the first capacitive node is electrically coupled to the voltage divider circuit,
 wherein the second capacitive node is electrically coupled to the first voltage via the start voltage circuit, and wherein the second capacitive node is electrically coupled to the output node via the transfer circuit; and in response to the input node changing in voltage level towards the first voltage, using the start voltage circuit to electrically disconnect the second capacitive node from the first voltage.

12. The method of claim 11, further comprising, in response to the input node changing in voltage level from the first voltage to ground, using the start voltage circuit to electrically connect the second capacitive node to the first voltage.

13. The method of claim 11, further comprising:

in response to the input node changing in voltage level towards the first voltage, using the voltage divider circuit and the capacitive circuit to change the second capacitive node from the first voltage to a second voltage; and in response to the input node changing in voltage level from the first voltage to ground, using the voltage divider circuit and the capacitive circuit to change the second capacitive node from the second voltage to the first voltage.

14. The method of claim 11, further comprising, in response to the input node changing in voltage level towards the first voltage, using the transfer circuit to (i) electrically connect the second capacitive node to the output node, and (ii) electrically disconnect the output node from the ground node.

15. The method of claim 11, further comprising in response to the input node changing in voltage level from the first voltage to ground, using the transfer circuit to (i) electrically disconnect the second capacitive node from the output node, and (ii) electrically connect the output node to the ground node.

16. A voltage translator circuit, comprising:

(a) an input node, an output node, and a ground node, wherein the ground node is electrically coupled to ground;

(b) a voltage divider circuit including a first resistor and a second resistor electrically coupled in series between the input node and the ground node;

(c) a start voltage circuit electrically coupled to a first voltage and to the input node;

(d) a transfer circuit electrically coupled to the output node; and (e) a capacitive circuit having a first capacitive node and a second capacitive node, wherein the first capacitive node is electrically coupled to the voltage divider circuit, wherein the second capacitive node is electrically coupled to the first voltage via the start voltage circuit, wherein the second capacitive node is electrically coupled to the output node via the transfer circuit, wherein in response to the input node changing in voltage level towards the first voltage, the start voltage circuit is capable of electrically disconnecting the second capacitive node from the first voltage, wherein in response to the input node changing in voltage level towards the first voltage, the voltage divider circuit and the capacitive circuit are capable of changing the second capacitive node from the first voltage to a second voltage, and wherein in response to the input node changing in voltage level towards the first voltage, the transfer circuit is capable of (i) electrically connecting the second capacitive node to the output node, and (ii) electrically disconnecting the output node from the ground node.

17. The voltage translator circuit of claim 16, wherein in response to the input node changing in voltage level from the first voltage to ground, the start voltage circuit is capable of electrically connecting the second capacitive node to the first voltage.

18. The voltage translator circuit of claim 16, wherein in response to the input node changing in voltage level from the first voltage to ground, the voltage divider circuit and the capacitive circuit are capable of changing the second capacitive node from a second voltage to the first voltage.

19. The voltage translator circuit of claim 16, wherein in response to the input node changing in voltage level from the first voltage to ground, the transfer circuit is capable of (i) electrically disconnecting the second capacitive node from the output node, and (ii) electrically connecting the output node to the ground node.

20. The voltage translator circuit of claim 16, further comprising a buffer circuit electrically coupled to a second voltage, to the output node, and to the ground node, wherein the buffer circuit comprises a CMOS inverter.

* * * * *